United States Patent
Krishnaswamy et al.

(10) Patent No.: US 7,607,115 B1
(45) Date of Patent: Oct. 20, 2009

(54) SYSTEM, METHOD AND COMPUTER PROGRAM PRODUCT FOR TIMING-INDEPENDENT SEQUENTIAL EQUIVALENCE VERIFICATION

(75) Inventors: Venkatram Krishnaswamy, Los Altos, CA (US); Shusaku Yamamoto, San Jose, CA (US); Junichi Tatsuda, Tokyo (JP)

(73) Assignee: Calypto Design Systems, Inc., Santa Clara, CA (US)

(*) Notice: Subject to any disclaimer, the term of this patent is extended or adjusted under 35 U.S.C. 154(b) by 251 days.

(21) Appl. No.: 11/538,751

(22) Filed: Oct. 4, 2006

(51) Int. Cl.
*G06F 17/50* (2006.01)
(52) U.S. Cl. .................................. 716/5; 716/6
(58) Field of Classification Search ............. 716/4–6
See application file for complete search history.

(56) References Cited

U.S. PATENT DOCUMENTS

| | | | |
|---|---|---|---|
| 7,031,900 B1* | 4/2006 | Vakada et al. ............ 703/17 |
| 7,076,753 B2* | 7/2006 | Cerny et al. ............. 716/5 |
| 7,100,060 B2* | 8/2006 | Cai et al. ............... 713/320 |
| 7,373,618 B1* | 5/2008 | Khoo et al. ............. 716/3 |
| 7,389,479 B2* | 6/2008 | Koelbl et al. ........... 716/3 |
| 2002/0144218 A1* | 10/2002 | Levin et al. ............ 716/4 |
| 2007/0136701 A1* | 6/2007 | Baumgartner et al. ... 716/5 |
| 2007/0220461 A1* | 9/2007 | Baumgartner et al. ... 716/5 |
| 2008/0072195 A1* | 3/2008 | Mukaiyama ............ 716/5 |
| 2008/0178132 A1* | 7/2008 | Baumgarter et al. .... 716/5 |

OTHER PUBLICATIONS

U.S. Appl. No. 11/129,238, filed May 12, 2005.

* cited by examiner

*Primary Examiner*—Stacy A Whitmore
(74) *Attorney, Agent, or Firm*—Zilka-Kotab, PC (57) ABSTRACT

A system, method and computer program product are provided for verifying sequential equivalence. In use, input is fed to a first system and a second system in a timing-independent manner to generate output. To this end, sequential equivalence of the first system and the second system may be verified, based on the output.

17 Claims, 7 Drawing Sheets

SYSTEM, METHOD AND COMPUTER PROGRAM PRODUCT FOR TIMING-INDEPENDENT SEQUENTIAL EQUIVALENCE VERIFICATION

BACKGROUND AND FIELD OF THE INVENTION

The present invention relates to verification applications, and more particularly, to verifying sequential equivalence.

SUMMARY

A system, method and computer program product are provided for verifying sequential equivalence. In use, input is fed to a first system and a second system in a timing-independent manner to generate output. To this end, sequential equivalence of the first system and the second system may be verified, based on the output.

DETAILED DESCRIPTION

Figure 1:
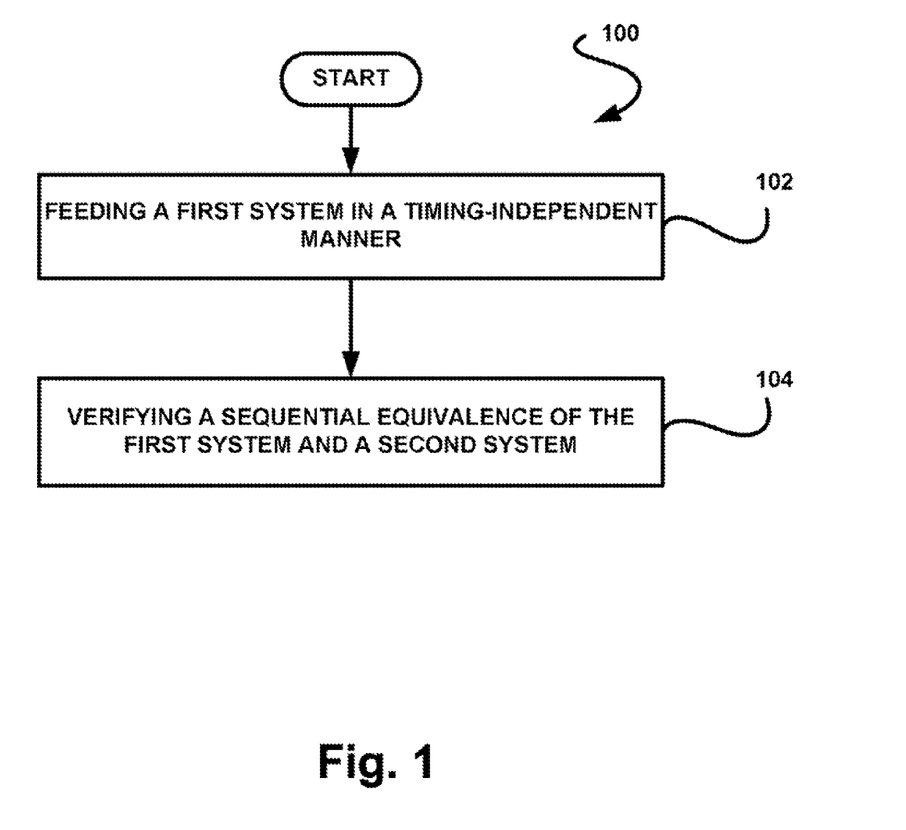
FIG. 1 illustrates a method for verifying sequential equivalence, in accordance with one embodiment.

FIG. 1 illustrates a method 100 for verifying sequential equivalence, in accordance with one embodiment. As shown, a first system and a second system are fed in a timing-independent manner to generate output. Note operation 102.

In the context of the present description, the first system and/or second system may include a system with a register transfer level (RTL) design including a notation of bit vectors and arrays. Of course, however, other embodiments [e.g. with system level model (SLM) designs, etc.] are also contemplated where there is at least one aspect between the first and second system which is different, but may nevertheless be equivalent.

One example of the aforementioned difference, in accordance with one embodiment, may involve a timing of various input and/or output of systems. In such embodiment, the second system may, for example, include a re-architected version of the first system, where the second system has timing differences with respect to the first system. Such re-architected design may involve the explicit instantiation of flip-flops, latches, etc. for the purpose of retiming, optimizing, etc. the design with additional focus on performance, power, etc.

It should be noted that the first system and second system may be fed in any desired manner that is timing-independent. In other words, a timing differences associated with various input of the first system and second system do not substantially impact an ability of the present method 100 to verify sequential equivalence of the systems, as will be elaborated hereinafter in greater detail.

Just by way of example, in one embodiment, instead of timing dependence, the first system and the second system are fed in an order-dependent manner. In one embodiment where the systems are fed instructions and components of data, the instructions and/or components that are fed in the first system and the second system are the same and are fed in the same order. Still yet, while the aforementioned output of the first and second systems may include any output thereof, it may, in the present embodiment, include instructions and/or components of data that have been processed by the associated system.

To this end, sequential equivalence of the first system and the second system may be verified in a timing-independent manner, based on the output. See operation 104. In the context of the present description, the term sequential equivalence may refer to a situation where two inputs that correspond with respect to at least one sequentially-related aspect (e.g. order, etc.) do not necessarily (but may) correspond in terms of other aspects such as timing, etc. In such situation, the outputs of the first and second systems would not exhibit any difference with respect to the sequentially-related aspect (e.g. order, etc.) but may (but do not necessarily) exhibit a difference with respect to the other aspects such as timing, etc.

In an optional embodiment, additional equivalence checking techniques may (or may not) be incorporated in operation 104. More information regarding such optional additional equivalence checking may be found with reference to a co-pending application filed May 12, 2005 under application Ser. No. 11/129,238, which is incorporated herein by reference in its entirety for all purposes.

To this end, the aforementioned verification of operation 104 may be carried out by manually and/or automatically comparing the outputs to determine whether the foregoing sequential equivalence exists. In another optional embodiment (which will now be described in greater detail), the aforementioned timing independent input-based sequential equivalence may be carried out utilizing a first-in-first-out (FIFO) data structure. While a FIFO data structure is discussed hereinafter in the context of an exemplary embodiment, it should be noted that other fixed-sized data structures, queues, hashes, and/or any other data structures may be used which are capable of the functionality of FIG. 1.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2A:
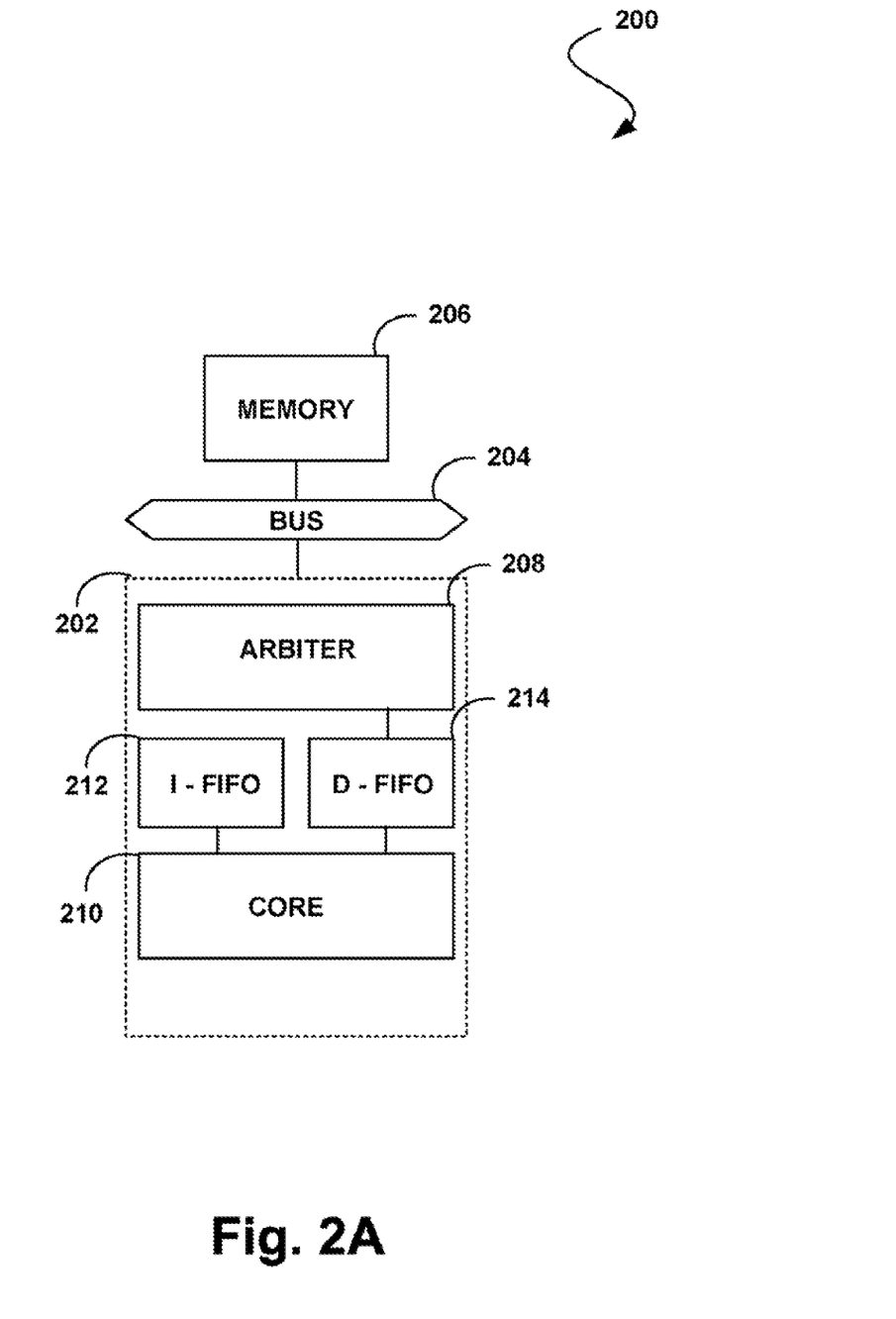
FIG. 2A illustrates an exemplary framework that may be verified against another framework for sequential equivalence, in accordance with one embodiment.

FIG. 2A illustrates an exemplary framework 200 that may be verified against another framework for sequential equivalence, in accordance with one embodiment. As an option, the framework 200 may be verified in the context of the method of FIG. 1. Further, the foregoing definitions may apply during the course of the present description.

As shown, a system 202 (e.g. see, for example, the first and second systems of FIG. 1, for example) is provided including a core 210 which communicates with both an instruction FIFO 212 capable of providing instructions in response to instruction requests and a data FIFO 214 capable of providing data in response to data requests. In use, the core 210 includes a processor pipeline adapted for requesting instructions from the instruction FIFO 212, decoding the requested instructions, and thereby processing data from the data FIFO 214 in accordance with the instructions.

Further included is an arbiter 208 in communication with the data FIFO 214 and memory 206 via a bus 204, in the manner shown. The arbiter 208 may serve to feed input from the memory 206 to the core 210 via the bus 204 for the purpose of collecting output that may be compared to another design. In one embodiment, the arbiter 208 may be configured to not mix instructions and data components when feeding the other portions of the framework 200. Note the lack of direct communication between the arbiter 208 and the instruction FIFO 212.

In use, such memory 206 may be stocked with software instructions/data that may be fed into the system 202 for the purpose of being run by the core 210. As an option, the instructions may include symbolic instructions for effecting a symbolic simulation utilizing the respective systems. In other words, the instructions may be mapped between a first and second system being compared. More information regarding such mapping will be set forth during reference to FIG. 3. As yet another option, a sequence of input (e.g. instructions, etc.) may be provided which is sufficiently long so as to input all possible combinations of input.

Figure 2B:
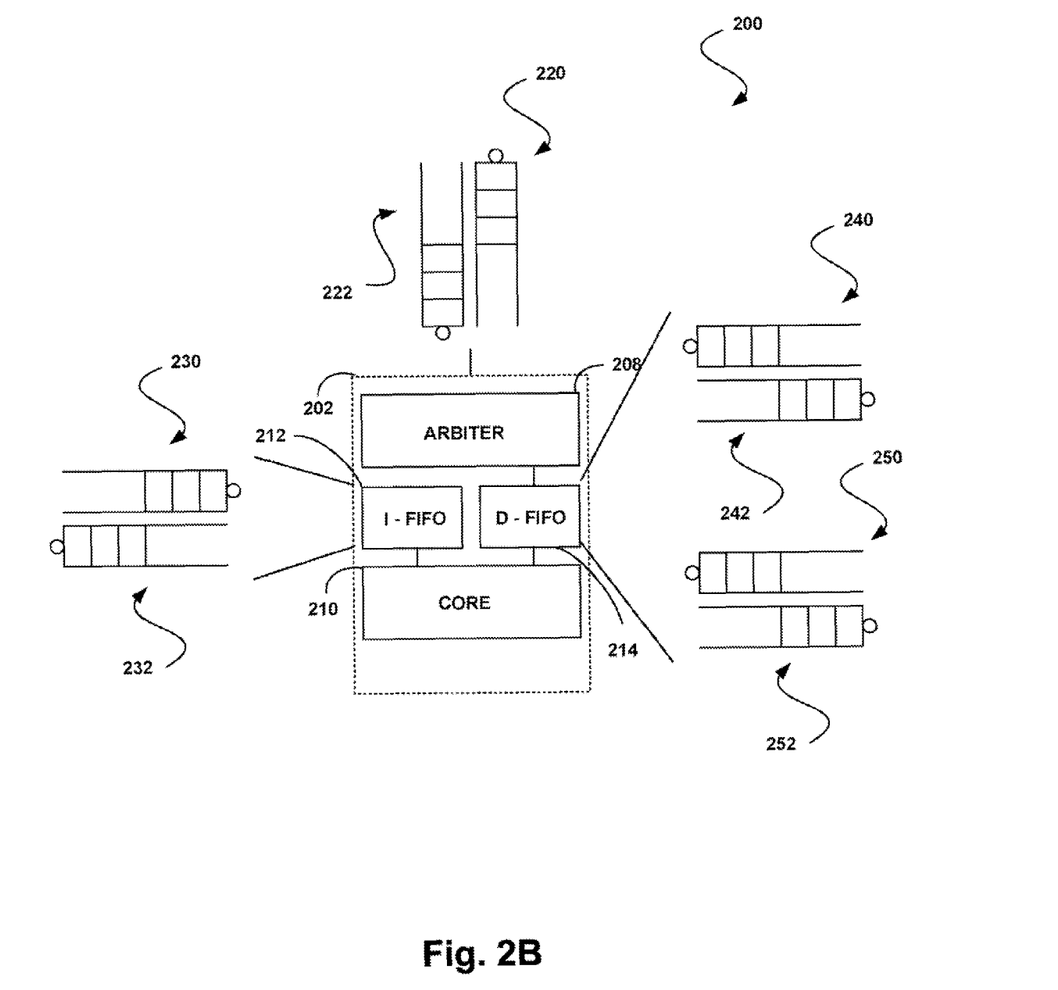
FIG. 2B illustrates the exemplary framework of FIG. 2A equipped with FIFOs for verifying sequential equivalence, in accordance with one embodiment.

FIG. 2B illustrates the exemplary framework 200 of FIG. 2A equipped with FIFOs for verifying sequential equivalence, in accordance with the present embodiment. As shown, the memory 206 of FIG. 2A may take the form of a pair of FIFOs including an input buffer 222 for feeding the arbiter 208 and an output buffer 220 for receiving data output from the system 200.

Still yet, the FIFOs 212, 214 of FIG. 2 may be configured as FIFO buffers for maintaining an order of instructions/data during execution. In particular, the instruction FIFO 212 of FIGS. 2A/2B may take the form of a pair of FIFOs including an input buffer 230 for feeding the core 210 with instructions (in response to instruction requests from the core 210), and an output buffer 232 for receiving the instruction requests output from the core 210. In one embodiment, the instruction FIFO 212 may be preloaded with instructions to serve this purpose, as will be elaborated upon hereinafter in greater detail.

Even still, the data FIFO 214 of FIGS. 2A/2B may also take the form of a pair of FIFOs including a first input buffer 240 for feeding the arbiter 208 and core 210, and a first output buffer 242 for receiving data output the from the arbiter 208 and core 210. Such first input buffer 240 and first output buffer 242 may specifically serve to receive and send data address information, respectively.

Still yet, the data FIFO 214 of FIGS. 2A/2B may also include a second input buffer 250 for feeding the arbiter 208 and core 210, and a second output buffer 252 for receiving data output from the arbiter 208 and core 210. Instead of data address information, the second input buffer 250 and second output buffer 252 may specifically serve to receive and send data components, respectively, that may be located using the aforementioned address information. As an option, while not shown, the instruction FIFO 212 may be configured with four buffers, similar to the data FIFO 214.

In operation, the framework 200 may be used for both a first and second system (e.g. see, for example, the first and second systems of FIG. 1, for example) so that sequential equivalence among the systems (and more particularly, the respective cores) may be verified. Specifically, the first input buffer 222 of the memory 206 of a first and second instance of the framework 200 (corresponding to separate first and second system designs) may be used to feed the first and second system, respectively. As mentioned earlier, a sequence of input (e.g. instructions, etc.) may be provided which is sufficiently long so as to input all possible combinations of input. Since the number of reads and writes is thus known, the FIFOs may be sized to be large enough to handle such known scenario.

After the input is fed, output of the first system may be collected in the output buffer 220 of the memory 206 of a first instance of the framework 200. Similarly, output of the second system may be collected in the output buffer 220 of the memory 206 of a second instance of the framework 200.

To this end, sequential equivalence among the systems may be verified by comparing the contents of the output buffer 220 of each instance of the framework 200.

Figure 3:
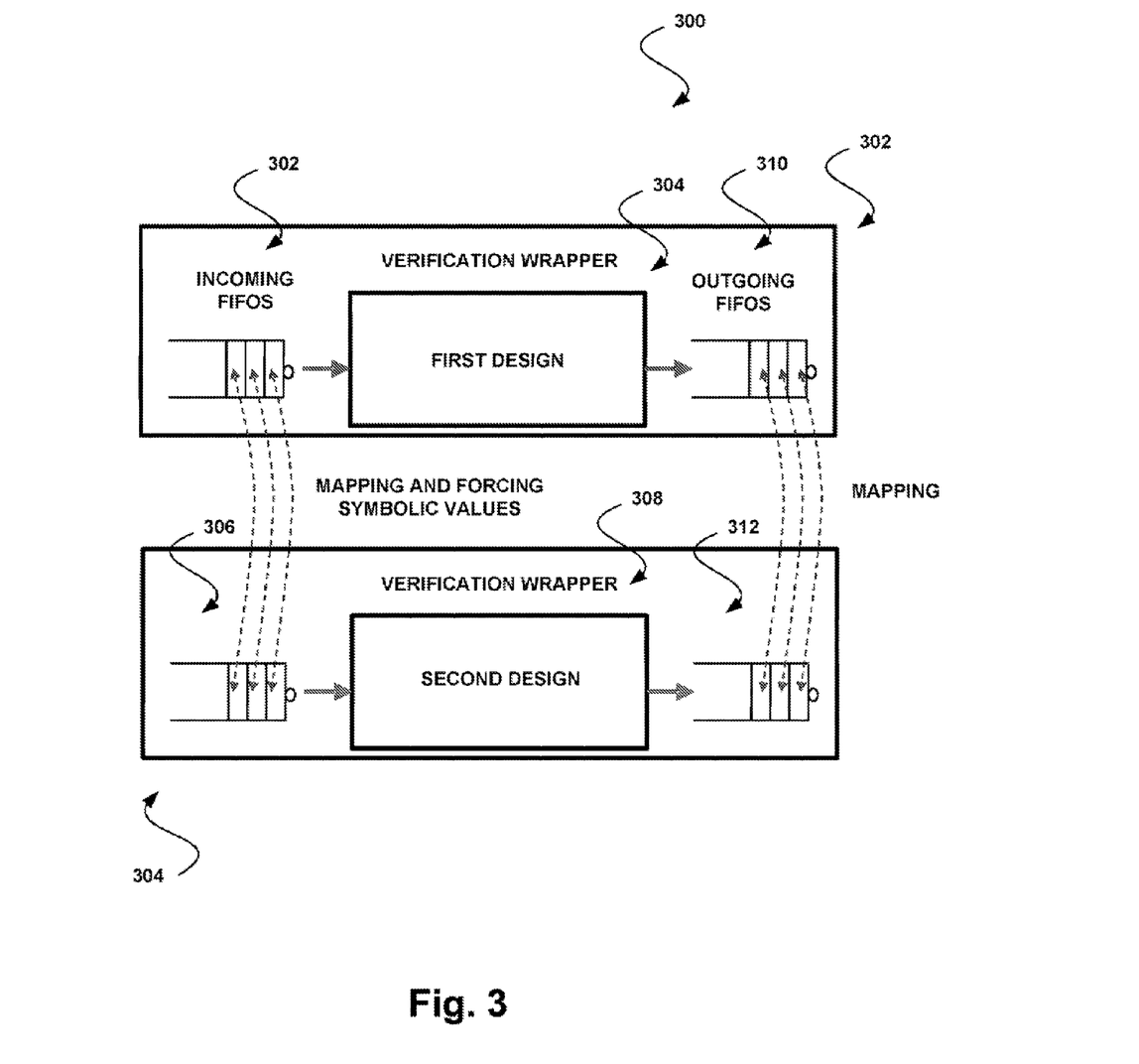
FIG. 3 shows a mapping for verifying sequential equivalence, in accordance with one embodiment.

FIG. 3 shows a mapping 300 for verifying sequential equivalence, in accordance with one embodiment. As an option, the mapping 300 may be implemented in the context of the architecture and/or functionality of FIGS. 1-2A/2B. For example, the illustrated first design 304 and second design 308 may each include an instantiation of the system 200 of FIGS. 2A/2B. Of course, however, the mapping 300 may be used in any desired environment.

As shown, the contents of the incoming FIFOs 302 of the first design 304 may be mapped with the contents of the incoming FIFOs 306 of the second design 308. Further, symbolic values may be forced, as shown. Similarly, the contents of the output FIFOs 310 of the first design 304 may be mapped with the contents of the outgoing FIFOs 312 of the second design 304. In both the incoming FIFOs 302, 306 and outgoing FIFOs 310, 312, the order is mapped to be same.

Figure 4A:
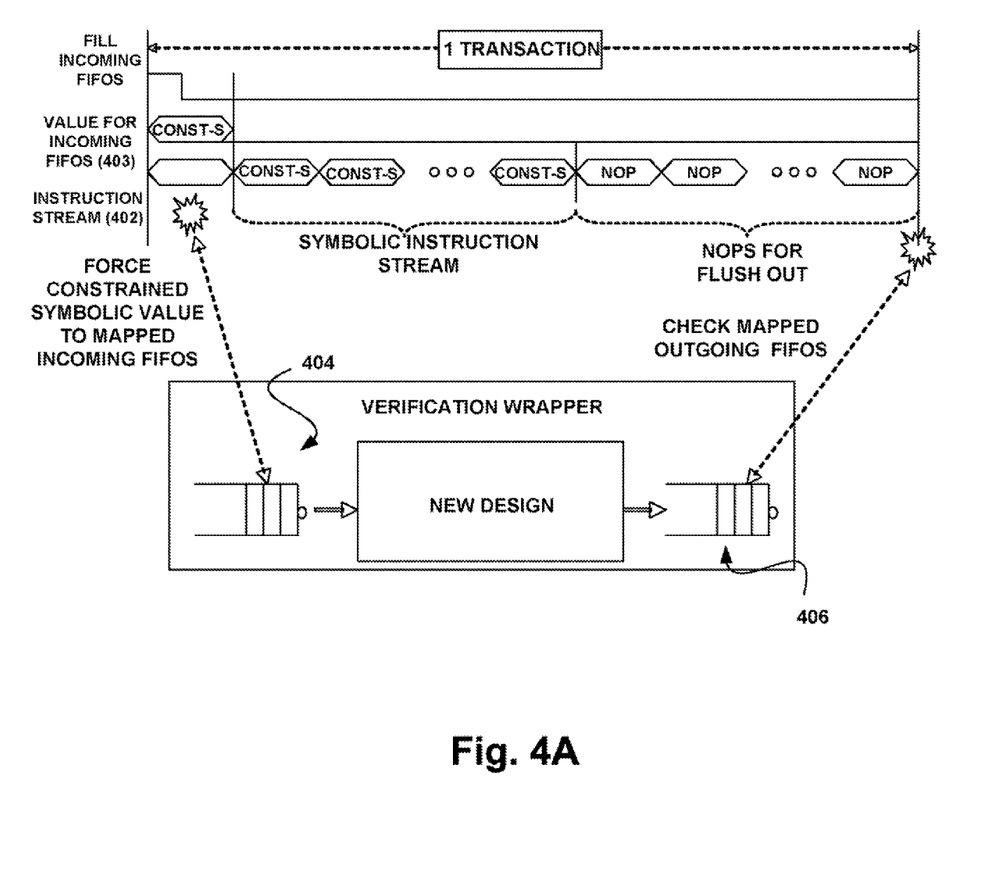
FIG. 4A illustrates the manner in which instructions and data may be fed into a first system for producing output that may be verified against that of a second system, in accordance with one embodiment.

FIG. 4A illustrates the manner in which instructions and data may be fed into a first system for producing output that may be verified against that of a second system, in accordance with one embodiment. As shown, an instruction stream 402 may be loaded in an input buffer 404 (e.g. see, for example, the input buffer 222 of FIG. 2B, etc.). Still yet, data values 403 may be also loaded into the appropriate buffer(s).

As shown, during execution, such instruction stream 402 may include a plurality of symbolic instructions followed by a plurality of no-operation instructions (NOPs). Such NOPs ensure that any output resulting from the symbolic instructions is fully outputted into the appropriate output buffer 406 (e.g. see, for example, the output buffer 220 of FIG. 2B, etc.) so that it may be properly verified.

Figure 4B:
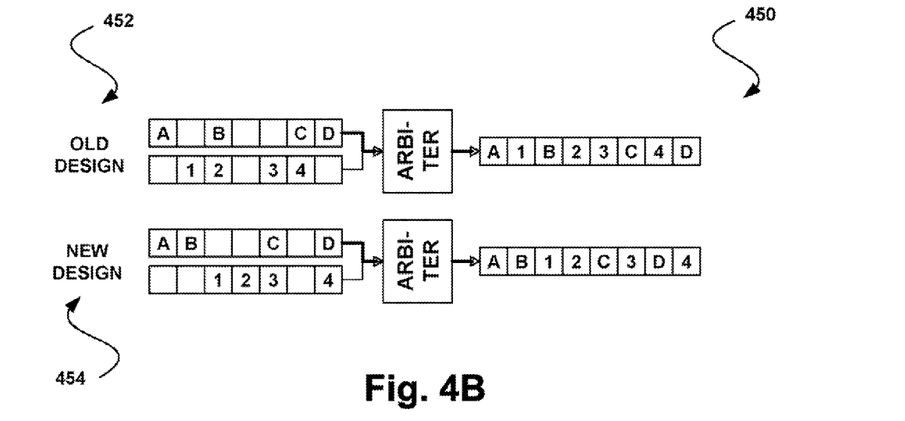
FIG. 4B shows an example of use during sequential equivalence verification, in accordance with one embodiment.

FIG. 4B shows an example of use 450 during sequential equivalence verification, in accordance with one embodiment. As an option, the example of use 450 may reflect the architecture and/or functionality of FIGS. 1-3. Of course, however, the example of use 450 may be carried out in any desired environment.

As shown, the input of instructions (e.g. A, B, C, etc.) of the first design 452 is illustrated to have the same order with respect to those of the second design 454, but with a different timing. Similarly, the input of data components (e.g. 1, 2, 3, etc.) of the first design 452 is illustrated to have the same order with respect to those of the second design 454, but with a different timing. A similar observation may be made with respect to the outputs.

In use, the instructions and components of the data may be verified separately. In other words, the order of the instructions may be compared and verified for equivalence independently with respect to the data, without necessarily mixing the instructions and data. For reasons that will soon become apparent, this may be done to avoid operations that would result in a re-ordering of the data components and/or instructions.

To this end, the input of instructions and data may be fed into the respective designs in a timing independent manner and nevertheless be verified for sequential equivalence by inspection and/or comparison of the order of the respective output. This may be done without necessarily knowing a timing relationship between the first design 452 and second design 454. In some embodiments, comparison of the data may be more important than comparison of instructions or visa-versa. In one optional embodiment, the timing-independence may optionally be subject to a throughput constraint (e.g. depth of an I/O FIFO, or other constraints, etc.). Further, such constraints may or may not be changed each time the equivalence is verified.

Figure 4C:
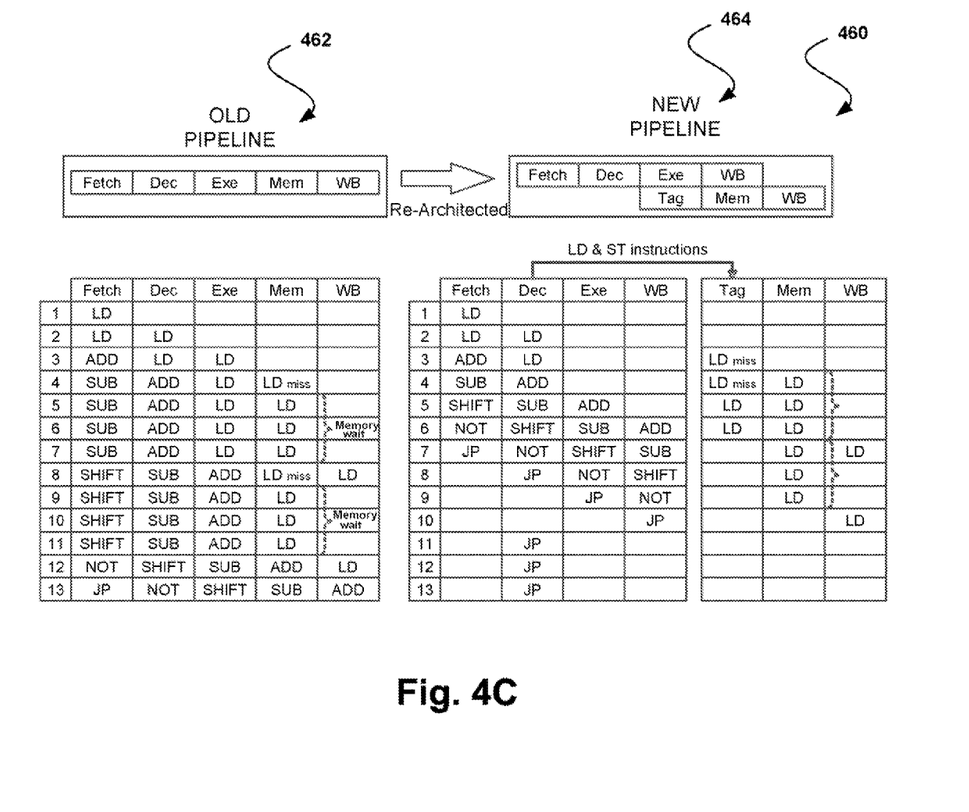
FIG. 4C shows an exemplary complex environment which may be subject to sequential equivalence verification, in accordance with one embodiment.

FIG. 4C shows an exemplary complex environment 460 which may be subject to sequential equivalence verification, in accordance with one embodiment. As shown, a first design 462 is shown to include multiple operations, namely a fetch operation, a decoding operation, an execution operation, a memory operation, and a write back operation. Still yet, a second design 464 is shown to include similar operations, namely a fetch operation, a decoding operation, an execution operation, a memory operation, and a write back operation.

However, instead of the memory operation of the first design 462, the second design 464 may be replaced with both a tag operation and a memory operation that are timed differently. Such re-architected second system 462 introduces timing complications that may make it very difficult to verify equivalence in a manner that takes such timing into account. Again, this is addressed by a timing independent verification involving the appropriate instructions and data, so that the designs may nevertheless be verified for sequential equivalence by inspection and/or comparison of the order of the respective output.

Of course, it should be noted that above example is set forth for illustrative purposes only and should not be construed as limiting in any manner.

Figure 5:
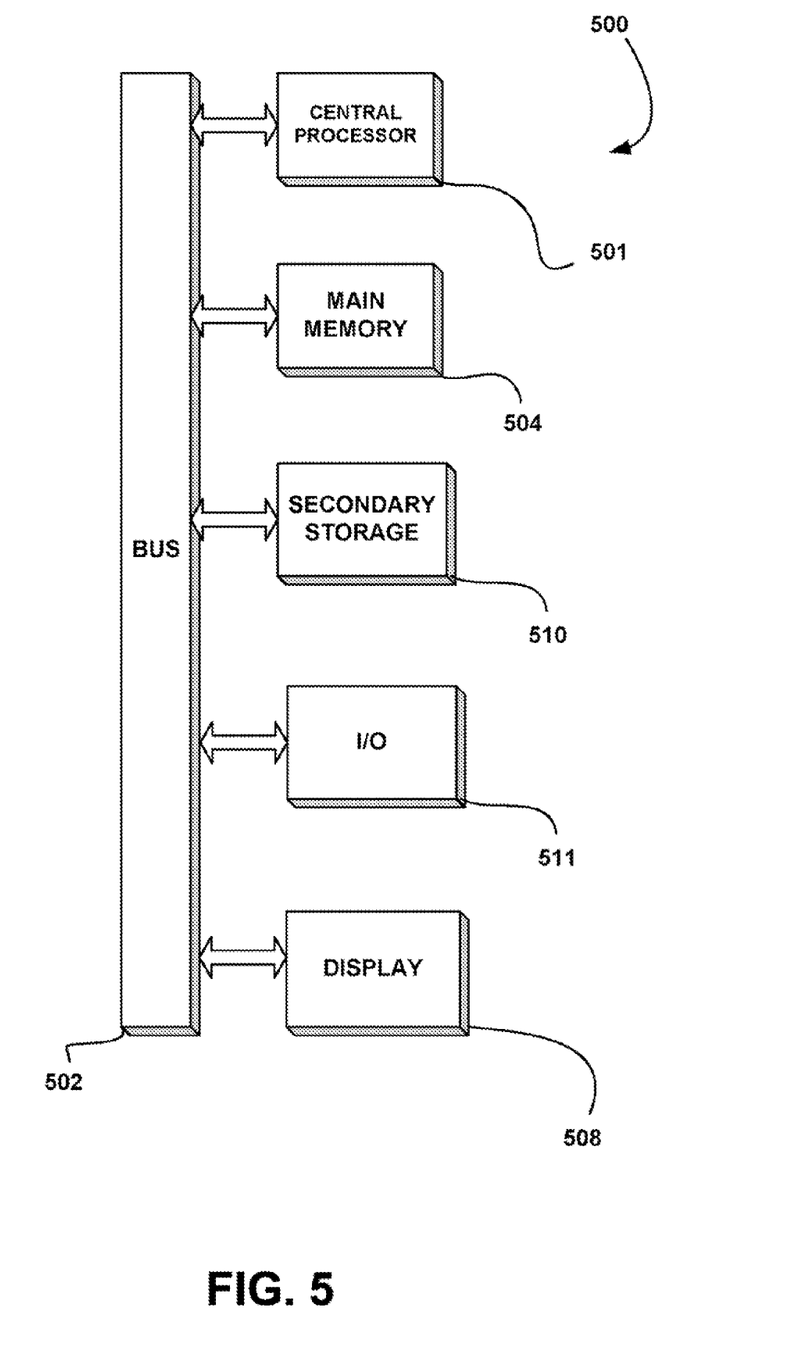
FIG. 5 illustrates an exemplary computer system in which the various architecture and/or functionality of the various previous embodiments may be implemented.

FIG. 5 illustrates an exemplary computer system 500 in which the various architecture and/or functionality of the various previous embodiments may be implemented. As shown, a computer system 500 is provided including at least one host processor 501 which is connected to a communication bus 502. The computer system 500 also includes a main memory 504. Control logic (software) and data are stored in the main memory 504 which may take the form of random access memory (RAM).

The computer system 500 also includes various I/O devices 511 (e.g. keyboard, mouse, camera, microphone, etc.) and a display 508, i.e. a computer monitor. The computer system 500 may also include a secondary storage 510. The secondary storage 510 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 504 and/or the secondary storage 510. Such computer programs, when executed, enable the computer system 500 to perform various functions. Memory 504, storage 510 and/or any other storage are possible examples of computer-readable media.

In one embodiment, such computer programs may be used to carry out the functionality of the previous figures. Further, in other embodiments, the architecture and/or functionality of the various previous figures may be implemented in the context of the host processor 501, a chipset (i.e. a group of integrated circuit designed to work and sold as a unit for performing related functions, etc.), and/or any other integrated circuit for that matter.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A verification method, comprising:
   feeding a first system and a second system in a timing-independent manner to generate output from the first system and the second system; and
   verifying a sequential equivalence of the first system and the second system, based on the output from the first system and the second system utilizing a processor;
   wherein a logical equivalence of the first system and the second system is verified, and the output from the first system and the second system has sequential differences and timing differences.

2. The method of claim 1, wherein the second system is a re-architected version of the first system.

3. The method of claim 1, wherein the first system and the second system are fed in an order-dependent manner.

4. The method of claim 1, wherein the first system and the second system are fed instructions and components of data.

5. The method of claim 4, wherein the instructions that are fed to the first system and the second system are the same and are fed in the same order.

6. The method of claim 4, wherein the components of data that are fed to the first system and the second system are the same and are fed in the same order.

7. The method of claim 4, wherein the instructions and the components of data are verified separately.

8. The method of claim 4, wherein the instructions include symbolic instructions.

9. The method of claim 1, wherein at least one of the feeding and the verifying is performed utilizing at least one first-in-first-out (FIFO) buffer.

10. The method of claim 9, wherein the at least one FIFO buffer is adapted for feeding at least one of the first system and the second system.

11. The method of claim 9, wherein the at least one FIFO buffer includes a first FIFO buffer for receiving a first output from the first system and a second FIFO buffer for receiving a second output from the second system.

12. The method of claim 11, wherein the verifying is performed by comparing the first output in the first FIFO buffer with the second output in the second FIFO buffer.

13. The method of claim 9, wherein the at least one FIFO buffer includes at least one instruction FIFO buffer for sending instructions in response to instruction requests.

14. The method of claim 13, wherein a processor pipeline is adapted for requesting instructions from the at least one instruction FIFO buffer and decoding the requested instructions.

15. The method of claim 9, wherein the at least one FIFO buffer includes at least one data FIFO buffer for buffering data.

16. A computer program product embodied on a tangible computer readable medium, comprising:
   computer code for feeding a first system and a second system to generate output from the first system and the second system; and
   computer code for verifying a sequential equivalence of the first system and the second system, based on the output from the first system and the second system;
   wherein the verification is performed in a timing-independent manner;
   wherein a logical equivalence of the first system and the second system is verified, and the output from the first system and the second system has sequential differences and timing differences.

17. A system including a tangible computer readable medium, comprising:

a first design;

a second design; and a verification wrapper, the verification wrapper capable of feeding the first design and the second design in a timing-independent manner to generate output from the first design and the second design, and verifying a sequential equivalence of the first design and the second design, based on the output from the first design and the second design;

wherein a logical equivalence of the first design and the second design is verified, and the output from the first design and the second design has sequential differences and timing differences.

* * * * *